(12) United States Patent
Akaogi (10) Patent No.: US 6,701,423 B2
(45) Date of Patent: Mar. 2, 2004

(54) HIGH SPEED ADDRESS SEQUENCER

(75) Inventor: Takao Akaogi, Cupertino, CA (US)

(73) Assignee: Fujitsu Limited, Kawasaki (JP)

( * ) Notice: Subject to any disclaimer, the term of this patent is extended or adjusted under 35 U.S.C. 154(b) by 162 days.

(21) Appl. No.: 09/919,070

(22) Filed: Jul. 30, 2001

(65) Prior Publication Data

US 2002/0184468 A1 Dec. 5, 2002

Related U.S. Application Data (60) Provisional application No. 60/294,386, filed on May 30, 2001.

(51) Int. Cl.$^7$ .............................................. G06F 12/00
(52) U.S. Cl. ...................................... 711/218; 711/219
(58) Field of Search ............................... 711/217, 218, 711/219

(56) References Cited

U.S. PATENT DOCUMENTS 6,038,648 A * 3/2000 Nakaoka ...................... 711/200
6,209,076 B1 * 3/2001 Blomgren .................... 711/214

* cited by examiner

Primary Examiner—Kevin Verbrugge
(74) Attorney, Agent, or Firm—Sheppard Mullin Richter & Hampton LLP (57) ABSTRACT

An address sequencer circuit for generating addresses for accessing a memory device. The address sequencer includes a plurality of address stages that are coupled together, and also includes a first clock generation circuit that receives an input clock and generates a first clock signal that is coupled to a first portion of the address stages. A second clock generation circuit is provided that receives the input clock and a toggle signal and generates a second clock signal that is coupled to a second portion of the address stages, thereby allowing the first and second portions of address stages to be clocked at different rates.

12 Claims, 7 Drawing Sheets

HIGH SPEED ADDRESS SEQUENCER

CROSS REFERENCE TO RELATED APPLICATIONS

This application claims priority from a U.S. Provisional Patent Application entitled, "HIGH SPEED ADDRESS SEQUENCER" Application No. 60/294,386 invented by Mr. Takao Akaogi and filed on May 30, 2001. The disclosure of which in incorporated herein in its entirety for all purposes.

FIELD OF THE INVENTION

The present invention relates to address sequencers, and more particularly, to a high speed address sequencer for generating addresses to access a memory device.

BACKGROUND OF THE INVENTION

Memory circuits, such as FLASH memory, require address generation or sequencer circuits to generate address values for various memory functions. For example, during burst mode operation of a flash memory, an address sequencer generates sequential addresses in response to a clock signal. Since memory densities have become higher and memory speeds faster, it has become necessary to have faster address sequencers.

Figure 1:
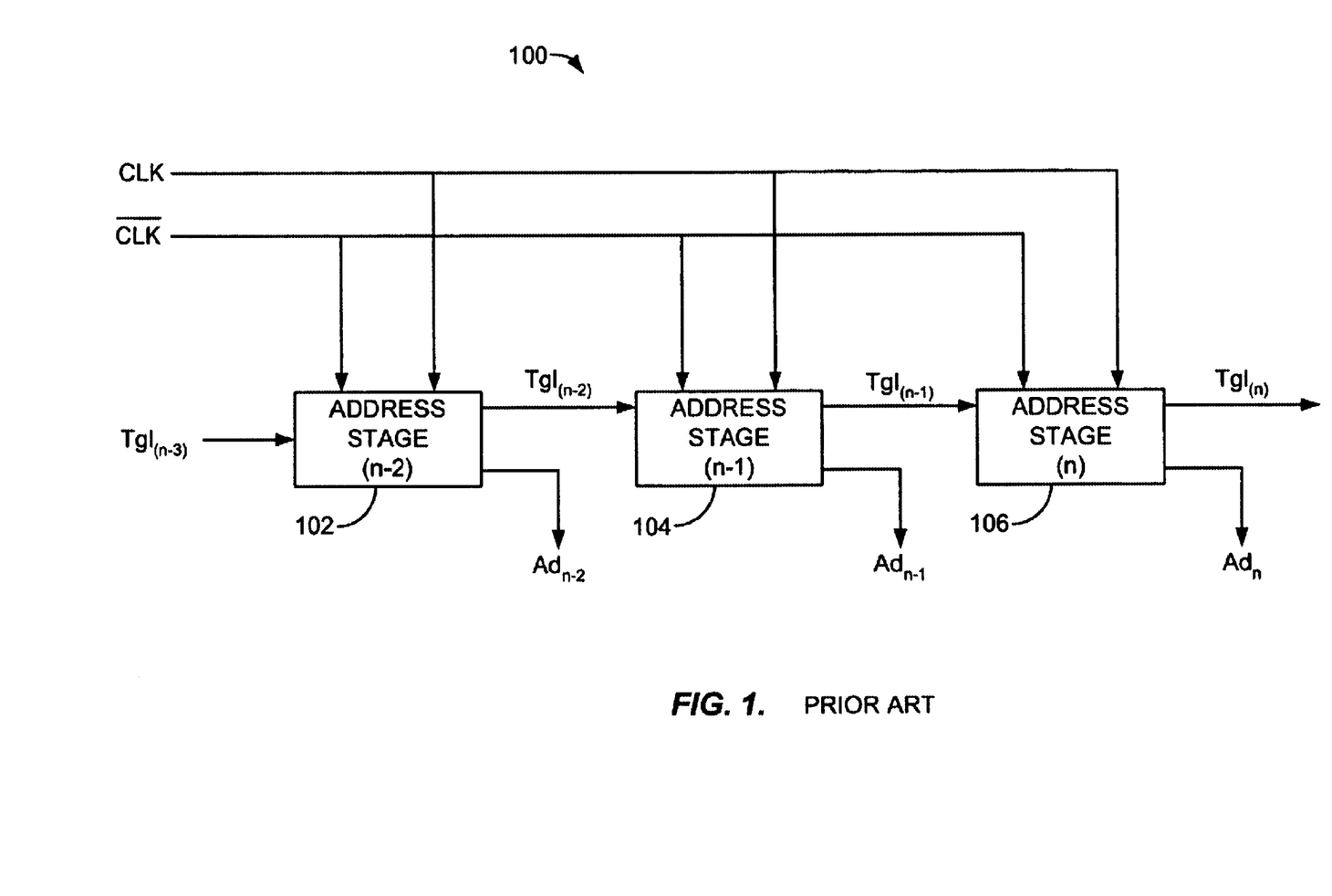
FIG. 1 shows a block diagram of a typical address sequencer circuit.

FIG. 1 shows a portion of a typical address sequencer 100 that provides address generation for use with a memory device. The sequencer 100 includes address stages 102, 104 and 106 that are coupled together to allow address toggle signals (Tgl) to propagate from one stage to the next stage. A clock signal (CLK) and an inverted version of the clock signal (CLK*) are provided to the address stages to provide timing for address generation and the propagation of the Tgl signals. During operation, sequential address signals (Ad) are generated by the address stages and used to access the memory device.

Figure 2:
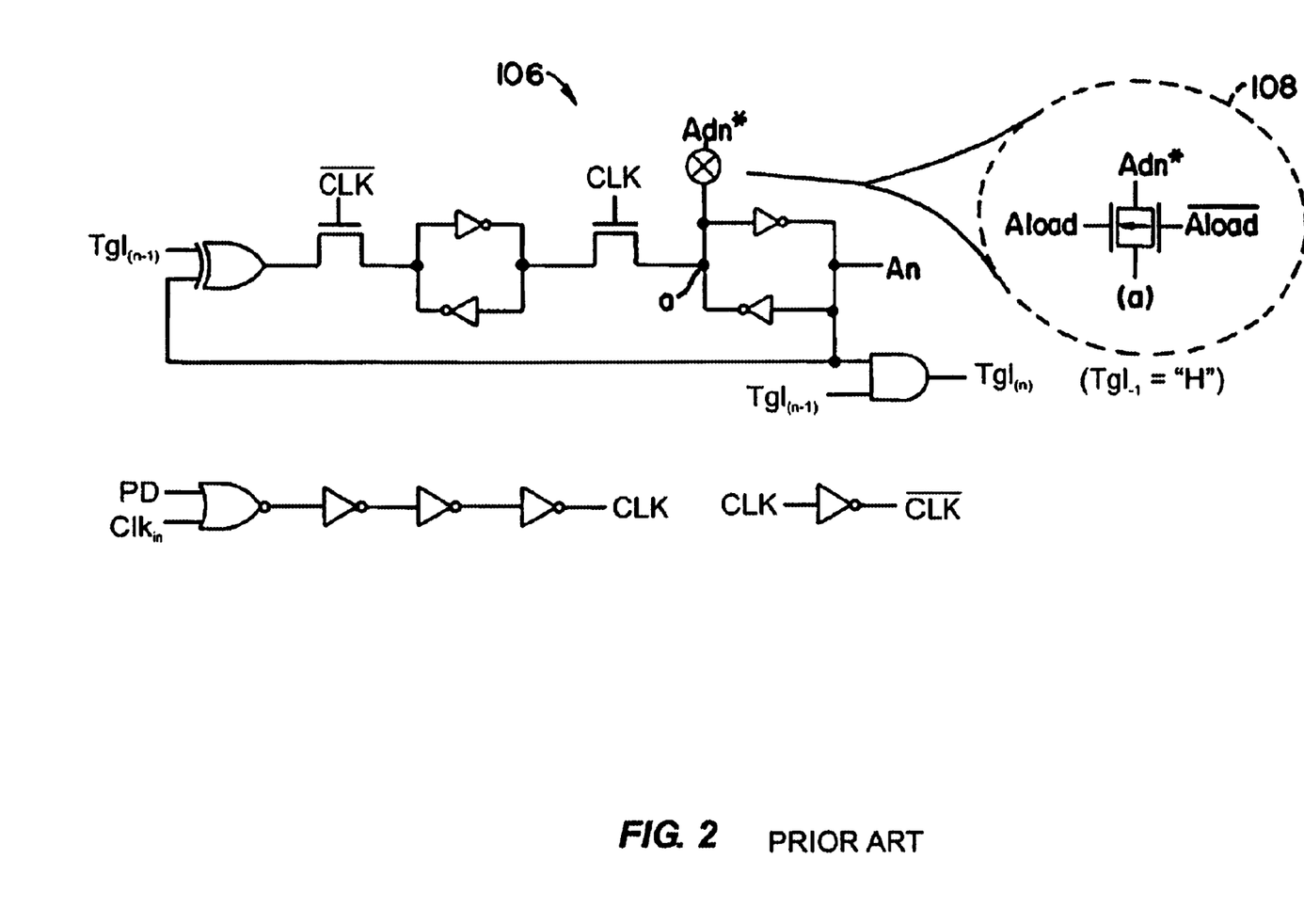
FIG. 2 shows a detailed diagram of an address stage of the address sequencer of FIG. 1.

FIG. 2 shows a detailed view of the address stage 106. During operation of the address stage 106, an address signal $Ad_n^*$ is received and used to set an initial value of $A_n$. As shown in a detailed circuit 108, during the initialization, an address load signal (Aload) goes to a high state so that the signal $Ad_n^*$ can propagate to the node "a". This occurs while the CLK signal stays at a low state.

When the CLK signal goes to a high state, the address stage output changes states dependant upon the state of the $Tgl_{(n-1)}$ signal. If the signal $A_n$ is in a high state and the toggle signal $Tgl_{(n-1)}$ is in a high state, then the signal $Tgl_{(n)}$ will be in a high state, which makes the signal $A_{n+1}$ of the next stage change states. Since the Tgl signals are connected in series (i.e. stage to stage) and have to change states within one CLK cycle, the propagation time of the Tgl signals through all the address stages may limit what the maximum CLK cycle speed can be.

Figure 3:
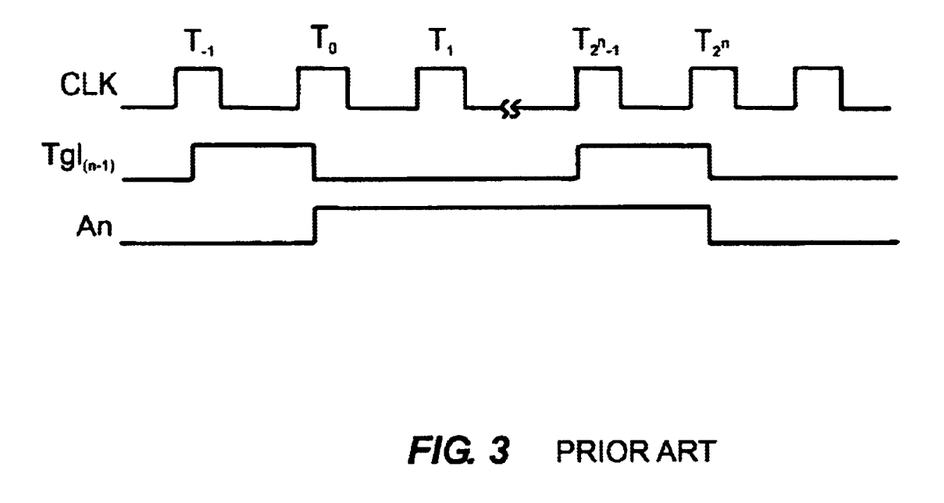
FIG. 3 shows a timing diagram of the address stage of FIG. 2.

FIG. 3 shows a timing diagram 300 that illustrates the signal timing of signals associated with the address stage 106 of FIG. 2. If $Tgl_{(n-1)}$ goes to the high state at cycle $T_{-1}$, the signal $A_n$ will go to the high state at cycle T(o). Furthermore, $A_n$ will not change its state until clock cycle $T_2^n$. As a result, the typical address sequencer limits the usable clock speed, since all stages must toggle within one clock cycle, and as a result, the propagation delay associated with the toggle signals begins to limit the usable clock speed.

Therefore, it would be desirable to have an address sequencer that overcomes the clock speed limitations present in current address sequencers.

SUMMARY OF THE INVENTION

The present invention includes an address sequencer system that overcomes limitations on usable clock speeds present in typical address sequencers. The sequencer design includes the generation of a secondary clock signal that is used to clock selected stages of the address sequencer. The cycle time of the secondary clock is longer than that of a main clock. Thus, the stages of the address sequencer driven by the secondary clock have a longer time to propagate address state changes.

In one embodiment of the invention, an address sequencer circuit for generating sequential addresses for accessing a memory device is provided. The address sequencer includes a plurality of address stages that are coupled together, and also includes a first clock generation circuit that receives an input clock and generates a first clock signal that is coupled to a first portion of the address stages. A second clock generation circuit is provided that receives the input clock and a toggle signal and generates a second clock signal that is coupled to a second portion of the address stages.

In anther embodiment of the invention, a method for generating sequential addresses from an address sequencer is provided. The address sequencer is used to access a memory device and the address sequencer includes a plurality of address stages that are coupled together. The method includes steps of receiving an input clock signal, generating a first clock signal from the input clock signal, wherein the first clock is coupled to a first portion of the address stages, and generating a second clock signal from the input clock signal and a toggle signal, wherein the second clock signal is coupled to a second portion of the address stages.

BRIEF DESCRIPTION OF THE DRAWINGS

The forgoing aspects and the attendant advantages of this invention will become more readily apparent by reference to the following detailed description when taken in conjunction with the accompanying drawings wherein.

DETAILED DESCRIPTION OF THE INVENTION

The present invention includes an address sequencer circuit that overcomes limitations on clock speeds present in typical address sequencers.

Figure 4:
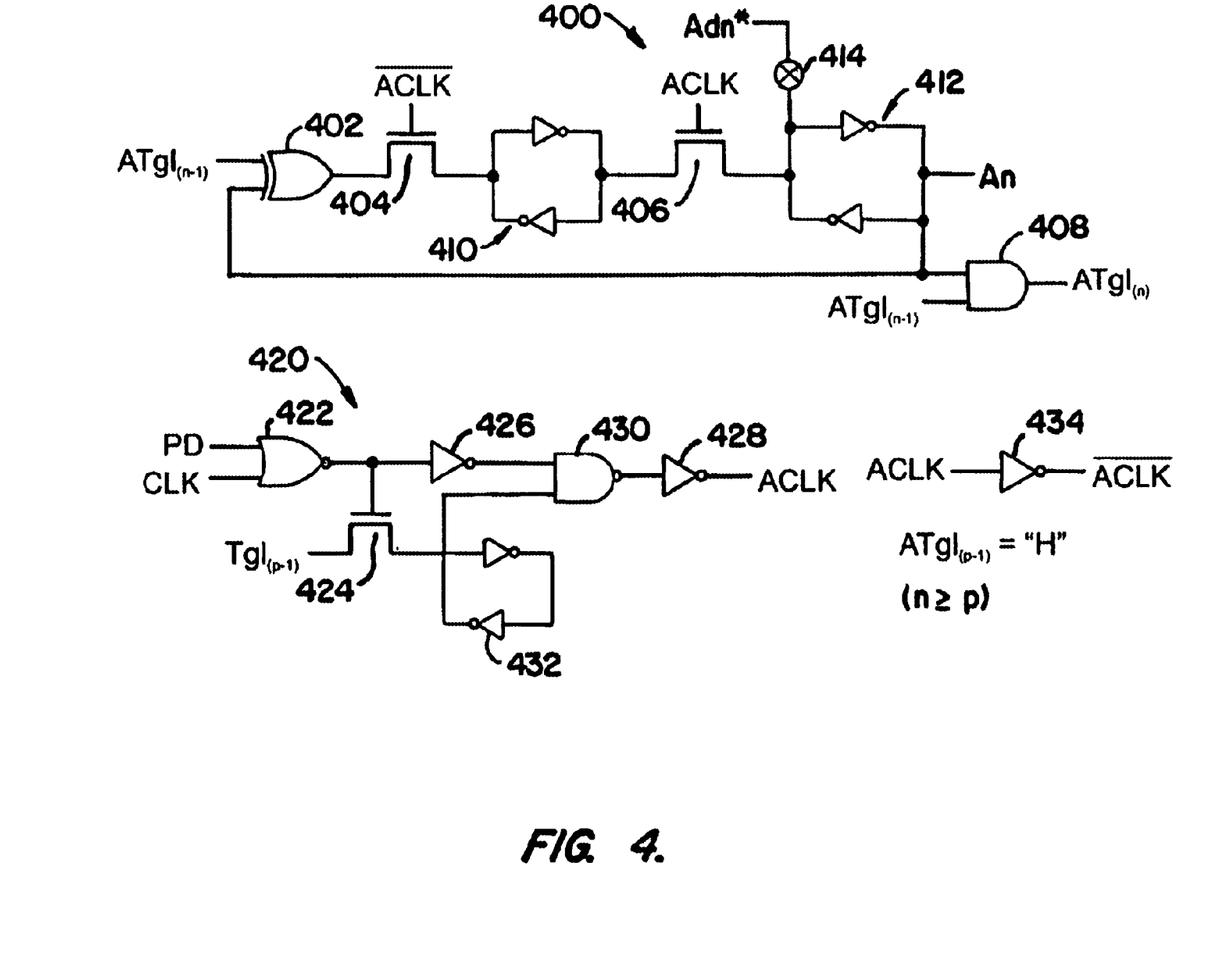
FIG. 4 shows an address stage circuit for use in an address sequencer in accordance with the present invention.

FIG. 4 shows one embodiment of an address stage circuit 400 constructed in accordance with the present invention and suitable for use in an address sequencer. The address stage 400 includes XOR gate 402, transistors 404, 406, AND gate 408, latch circuits 410, 412 and initialization circuit 414. The address stage 400 includes clock circuit 420 that generates timing clocks used by the address stage 400. The clock circuit includes NOR gate 422, transistor 424, inverters 426, 428, NAND gate 430 and latch circuit 432. An additional inverter 434 is used to provide an inverter clock (ACLK*) signal. A power down (PD) signal is coupled to the clock circuit 420, however, this signal is used for power down operation only and will not be described in detail here. It will be assumed that the PD signal is held in a state that allows normal operation of the clock circuit 420.

For the following description it will be assumed that the maximum number of address stages in the address sequencer is equal to M, and that n is an address stage index that ranges from n=0 to n=M−1, and that p is a particular address stage that is pre-selected. Each of the address stages prior to stage p uses a fast clock (CLK), and may be implemented by the circuit shown in FIG. 2. Each of the address stages p and beyond uses the slower clock ACLK, and is implemented by circuit 400. For address stage n=p, the toggle signal $ATgl_{(n-1)}$ to XOR gate 402 is designated as $ATgl_{(p-1)}$, and is set to a logic high value, as indicated in FIG. 4. The toggle signal $Tgl_{(p-1)}$ is provided by address stage n=p−1, which may be implemented by an instance of the circuit shown in FIG. 2. In the address stage 400 the cycle time of ACLK is $2^p$ times as long as the cycle time of the CLK signal. This is true since the CLK signal is gated by toggle signal $Tgl_{(p-1)}$ at the NAND gate 430 to produce the ACLK signal. For example, assuming the maximum number of address stages (M) is 21 and address stage 1 is picked as the particular address stage "p", then the cycle time of ACLK is 2 times as long as CLK. This means that the address sequencer can operate with 2 times as fast a clock speed than the conventional address buffer. If the ACLK signal is then used to clock the address stages form stage p and beyond, there is enough time for the toggle signals (Tgl) to propagate from address stage p to address stage m. As a result, address stages prior to stage p use a first clock signal and address stages p and beyond use a second clock signal that is slower than the first clock signal.

Figure 5:
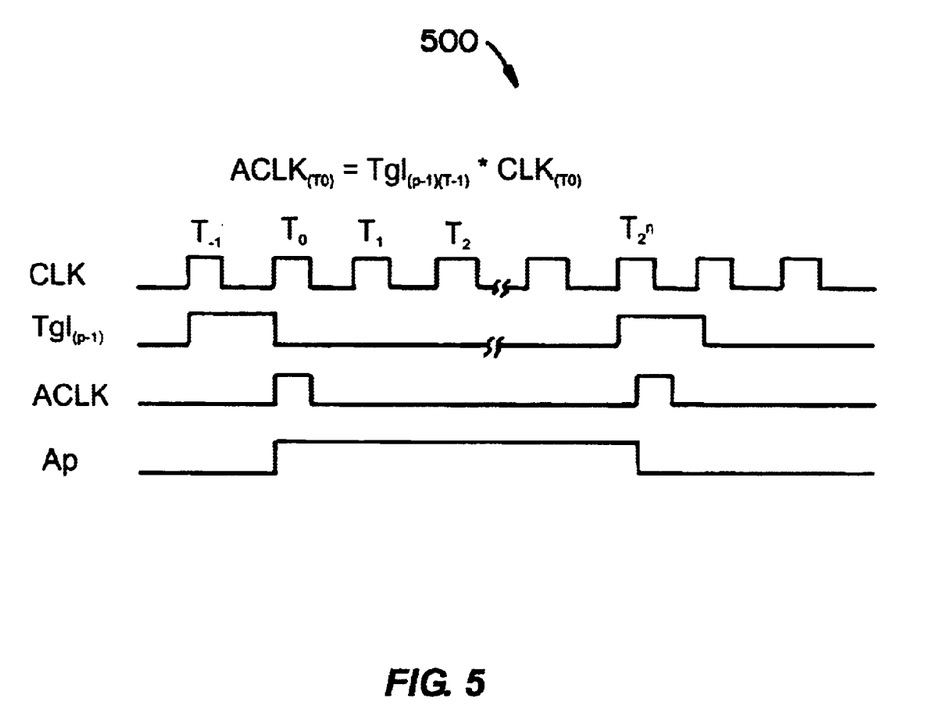
FIG. 5 shows a timing diagram illustrating signal timing of signals associated with the address stage circuit of FIG. 4.

FIG. 5 shows timing diagram 500 that includes the ACLK signal provided by the clock circuit 420 of FIG. 4. The ACLK signal is generated (by the clock circuit 420) by gating the CLK signal with a signal derived from the toggle signal $Tgl_{(p-1)}$. The ACLK signal is applied to address buffers which are indexed by p and greater. For example:

$$ACLK_{(T0)} = Tgl_{(p-1)(T-1)} * CLK_{(T0)}.$$

As a result, the address stage Ap toggles with the ACLK signal and those address stages subsequent to stage p will have additional time to toggle.

Figure 6:
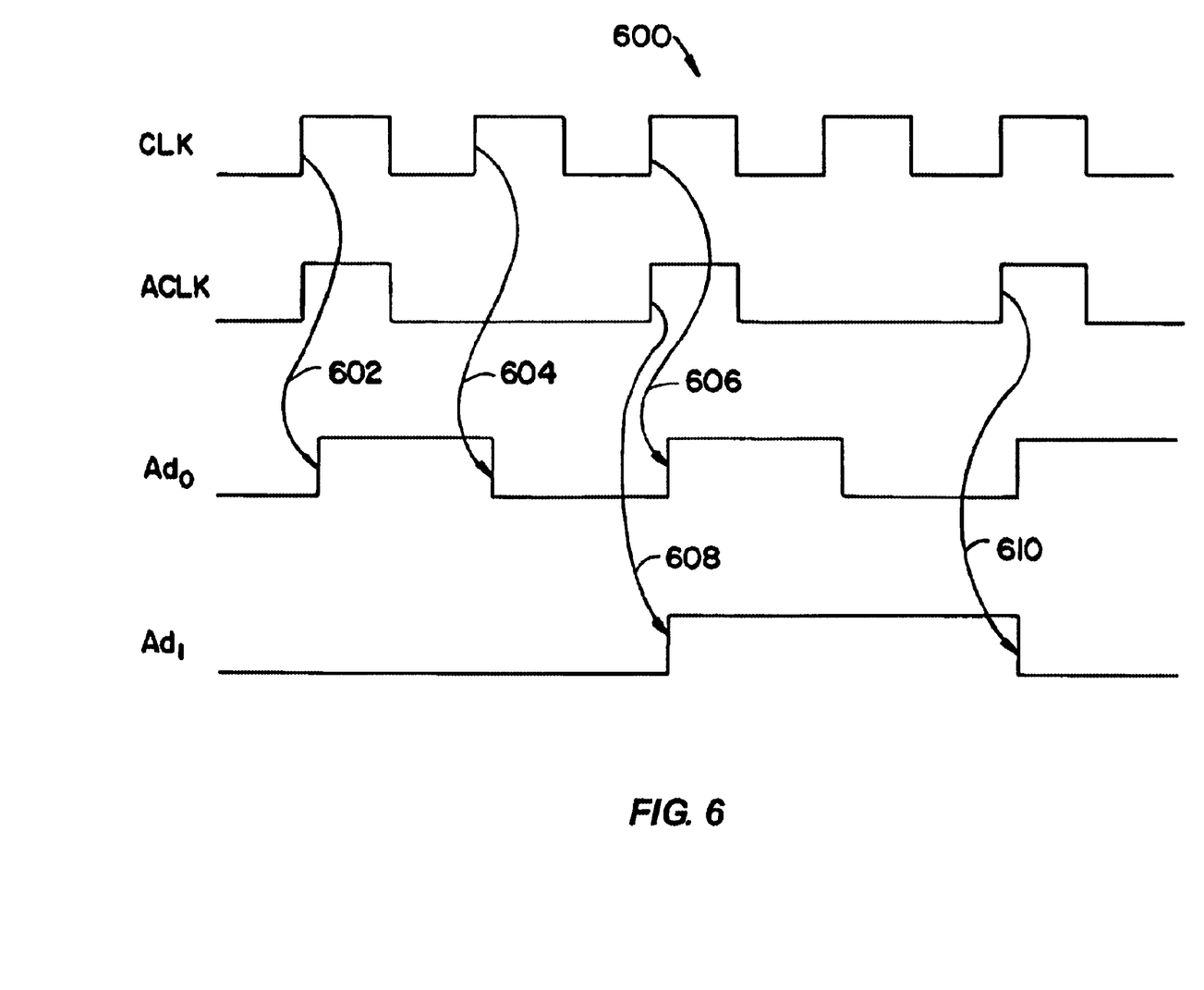
FIG. 6 shows a timing diagram illustrating signal timing of address signals associated with the address stage circuit of FIG. 4.

FIG. 6 shows an exemplary timing diagram 600 of timing signals associated with one embodiment of the present invention. The signal timing represented in FIG. 6 is representative of signal timing that occurs as a result of selecting p to equal to 1. For example, a rising edge of the CLK signal generates a change in state of address zero ($Ad_0$) as shown at 602, 604, 606 and so on. The ACLK signal has twice the cycle time of the CLK signal and is used to clock address stages beyond ($Ad_0$). Therefore, a rising edge of the ACLK signal generates a change of state of address one ($Ad_1$) as shown at 608 and 610. Since all address stages beyond ($Ad_0$) use the ACLK, there will exist additional time for the toggle signals of successive address stages to propagate through the address stages. This allows the use of a very high speed clock to clock the least significant and fast changing address stages, while a slower clock is used to clock the more significant address stages found at stages p and beyond.

As a result, the address sequencer circuit included in the present invention is capable of running at higher clock speeds than conventional circuits. It is also possible to select which address stages will receive the higher speed clock and which will receive the lower speed clock. By selecting the desired value of p, it is possible to select the desired address stage that acts as the first stage to receive the lower speed clock. Furthermore, selecting the desired value for p determines the rate of the low clock, since it is derived from the high speed clock gated by the toggle signal $Tgl_{(p-1)}$.

Figure 7:
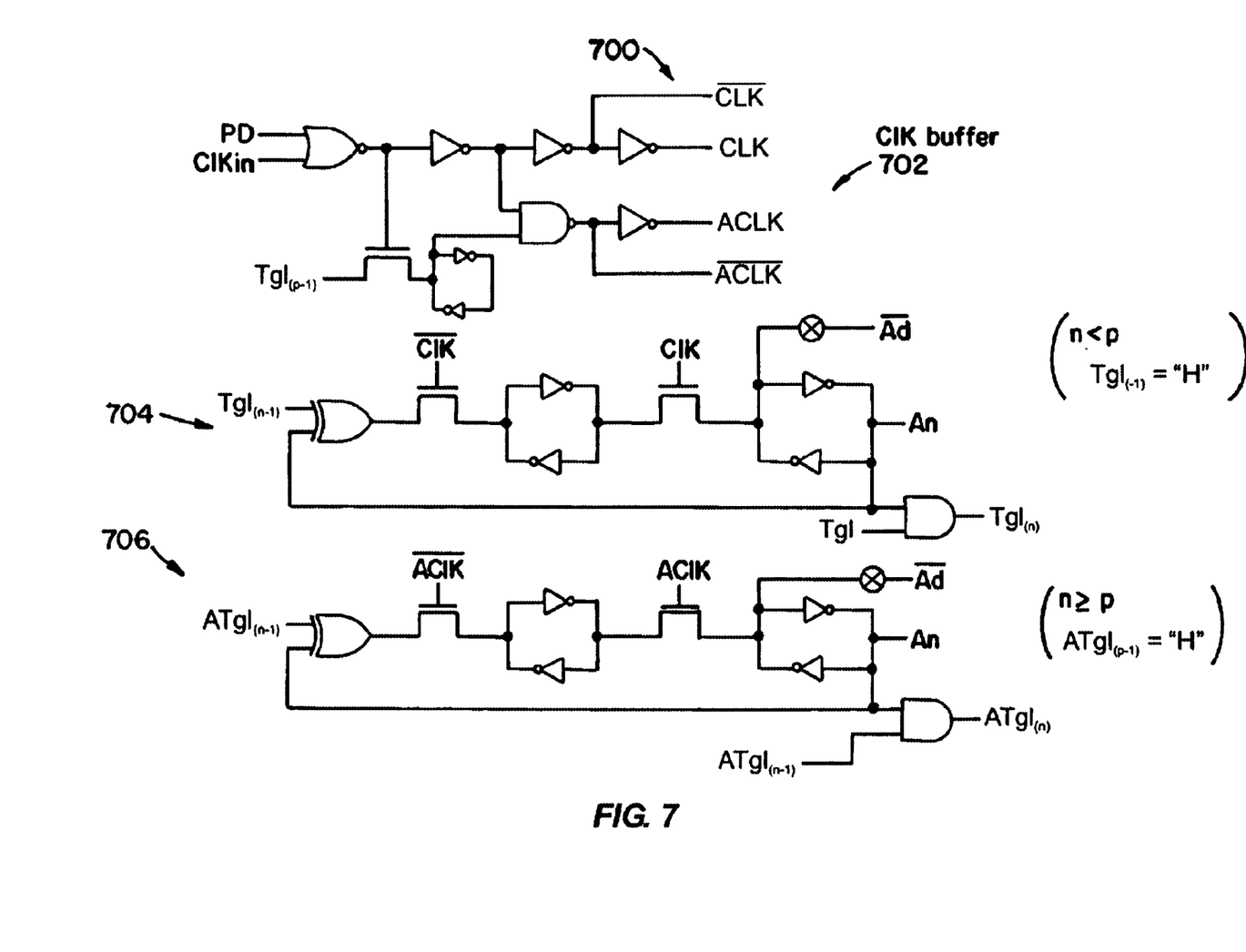
FIG. 7 shows a circuit for an address sequencer constructed in accordance with the present invention.

FIG. 7 shows one embodiment of an address sequencer 700 constructed in accordance with the present invention. The address sequencer 700 includes a clock buffer circuit 702 that generates the CLK signal and the ACLK signal as described above. Assuming a value of p is chosen to indicate the address stage where the low speed clock (ACLK) will first be introduced. As a result, the address stage 704 is used for all address stages having an index reference less than p. These address stages use the CLK signal having a higher clocking speed. The toggle output of the n=(p1) stage ($Tgl_{(p-1)}$ is provided as an input to clock buffer 702, as shown in FIG. 7. The address stage 706 is used for all address stages having an index reference greater than or equal to p. For address stage n=p, the toggle signal $ATgl_{(n-1)}$, and is set to a logic high value, as indicated in FIG. 7. These address stages use the ACLK signal having a lower clocking speed. Therefore, by combining the address stages clocked with the CLK signal and the address stages clocked with the ACLK signal, a high-speed address sequencer is formed that does not have the clock speed limitations of conventional sequencers.

The present invention includes an address sequencer that overcomes limitations on clock speeds present in typical address sequencers. The embodiments described above are illustrative of the present invention and are not intended to limit the scope of the invention to the particular embodiments described. Accordingly, while several embodiments of the invention has been illustrated and described, it will be appreciated that various changes can be made therein without departing from the spirit or essential characteristics thereof. Accordingly, the disclosures and descriptions herein are intended to be illustrative, but not limiting, of the scope of the invention which is set forth in the following claims.

What is claimed is:

1. An address sequencer circuit for generating addresses for accessing a memory device, the address sequencer includes a plurality of address stages that are coupled together, the address sequencer comprising:

a first clock generation circuit that receives an input clock and generates a first clock signal, wherein the first clock signal is coupled to a first portion of the address stages; and a second clock generation circuit that receives the input clock and a toggle signal and generates a second clock signal, wherein the second clock signal is coupled to a second portion of the address stages.

2. The address sequencer circuit of claim 1, wherein the address stages are coupled together in series and the toggle signal is output from a selected address stage in the first portion of address stages.

3. The address sequencer circuit of claim 2, wherein the selected address stage is a last address stage in the first portion of address stages.

4. The address sequencer circuit of claim 3, wherein the first and second portions of the address stages include all of the address stages in the plurality of address stages, and wherein no address stage is in both the first and second portions of address stages.

5. The address sequencer circuit of claim 4, wherein addresses generated by the first portion of the address stages have lower significance than addresses generated by the second portions of the address stages.

6. The address sequencer circuit of claim 5, wherein a cycle time of the first clock signal is shorter than a cycle time of the second clock signal.

7. A method for generating addresses from an address sequencer that is used to access a memory device, the address sequencer includes a plurality of address stages that are coupled together, the method comprising steps of:

receiving an input clock signal;

generating a first clock signal from the input clock signal, wherein the first clock is coupled to a first portion of the address stages; and generating a second clock signal from the input clock signal and a toggle signal, wherein the second clock signal is coupled to a second portion of the address stages.

8. The method of claim 7, wherein the address stages are coupled together in series and the method further includes a step of receiving the toggle signal from a selected address stage in the first portion of address stages.

9. The method of claim 8, wherein the step of receiving the toggle signal is a step of receiving the toggle signal from the selected address stage in the first portion of address stages, wherein the selected address stage is a last address stage in the first portion of address stages.

10. The method of claim 9, further comprising a step of selecting the first and second portions of the address stages to include all of the address stages in the plurality of address stages, and wherein no address stage is in both the first and second portions of address stages.

11. The method of claim 10, further comprising a step of selecting the first and second portions of the address stages so that addresses generated by the first portion of the address stages have lower significance than addresses generated by the second portions of the address stages.

12. The method of claim 11, wherein the step of generating a second clock signal further includes a step of generating a second clock signal so that a cycle time of the first clock signal is shorter than a cycle time of the second clock signal.

* * * * *